US 6,717,964 B2

(12) United States Patent
Jiang et al.

(10) Patent No.: US 6,717,964 B2
(45) Date of Patent: Apr. 6, 2004

(54) METHOD AND APPARATUS FOR WAVELENGTH TUNING OF OPTICALLY PUMPED VERTICAL CAVITY SURFACE EMITTING LASERS

(75) Inventors: Wenbin Jiang, Thousand Oaks, CA (US); Hsing-Chung Lee, Calabasas, CA (US)

(73) Assignee: E20 Communications, Inc., Calabasas, CA (US)

(*) Notice: Subject to any disclaimer, the term of this patent is extended or adjusted under 35 U.S.C. 154(b) by 115 days.

(21) Appl. No.: 09/898,191

(22) Filed: Jul. 2, 2001

(65) Prior Publication Data

US 2003/0002545 A1 Jan. 2, 2003

(51) Int. Cl.⁷ .............................. H01S 3/10; H01S 5/00
(52) U.S. Cl. .......................................... 372/20; 372/43

(56) References Cited

U.S. PATENT DOCUMENTS

| | | |
|---|---|---|
| 3,949,320 A | 4/1976 | Castleberry et al. |
| 4,149,118 A | 4/1979 | Winterling et al. |
| 4,272,733 A | 6/1981 | Walling et al. |
| 4,385,388 A | 5/1983 | Engelking |
| 4,490,822 A | 12/1984 | Wallin et al. |
| 4,633,476 A | 12/1986 | Scifres et al. |
| 4,719,636 A | 1/1988 | Yamaguchi |
| 4,748,632 A | 5/1988 | Preston |
| 4,841,530 A | 6/1989 | Chai et al. |
| 4,852,108 A | 7/1989 | Utaka et al. |

(List continued on next page.)

FOREIGN PATENT DOCUMENTS

DE  44 44 470 A1  11/1994

OTHER PUBLICATIONS

Joseph T. Verdeyen; Laser Electronics, Third Edition; pgs 347–351, 517–534; 1981; Prentice–Hall, Inc. New Jersey.
Eli Kapon; Semiconductor Lasers II, Materials and Structures; pp. 164–179; Institute of Micro and Optoelectronics Department of Physics Swiss Federal Institute of Technology, Lausanne; Academic Press; 1999.

(List continued on next page.)

*Primary Examiner*—Paul Ip
*Assistant Examiner*—Phillip Nguyen
(74) *Attorney, Agent, or Firm*—Blakely Sokoloff Taylor & Zafman (57) ABSTRACT

A tunable vertical cavity surface emitting laser (VCSEL) is formed by providing a gap in its laser cavity that can be adjusted to vary the gap distance therein to change the resonance of the cavity and the wavelength of photons that are generated. A pump laser provides a pump source of photons that are coupled into the laser cavity of the vertical cavity surface emitting laser. The vertical cavity surface emitting laser is coupled to a piezo-electric submount to form the gap in the laser cavity. The gap distance is adjusted to tune the vertical cavity surface emitting laser around its center wavelength by applying a voltage (i.e., an electric field) across the piezo-electric submount which causes mechanical stress therein. Alternate embodiments are disclosed including a joined unit of elements to form the tunable vertical cavity surface emitting laser as well as a system of elements to form the tunable vertical cavity surface emitting laser.

52 Claims, 6 Drawing Sheets

U.S. PATENT DOCUMENTS

| | | | |
|---|---|---|---|
| 4,856,005 A | 8/1989 | Oe et al. |
| 4,873,691 A | 10/1989 | Uomi et al. |
| 4,878,104 A | 10/1989 | Reed et al. |
| 4,901,330 A | 2/1990 | Wolfram et al. |
| 4,955,028 A | 9/1990 | Alferness et al. |
| 4,977,564 A | 12/1990 | Ryu et al. |
| 4,977,565 A | 12/1990 | Shimosaka |
| 4,980,892 A | 12/1990 | Cunningham et al. |
| 5,001,722 A | 3/1991 | Klement et al. |
| 5,008,717 A | 4/1991 | Bar-Joseph et al. |
| 5,022,038 A | 6/1991 | Bradley |
| 5,022,745 A | 6/1991 | Zayhowski et al. |
| 5,023,879 A | 6/1991 | Wang et al. |
| 5,058,124 A | 10/1991 | Cameron et al. |
| 5,070,509 A | 12/1991 | Meyers |
| 5,088,105 A | 2/1992 | Scifres et al. |
| 5,090,019 A | 2/1992 | Scheps |
| 5,101,414 A | 3/1992 | Schilling et al. |
| 5,103,456 A | 4/1992 | Scifres et al. |
| 5,119,393 A | 6/1992 | Oka et al. |
| 5,157,681 A | 10/1992 | Aoyagi et al. |
| 5,163,058 A | 11/1992 | Farries et al. |
| 5,164,954 A | 11/1992 | Su |
| 5,165,065 A | 11/1992 | Reed et al. |
| 5,173,909 A | 12/1992 | Sakano et al. |
| 5,177,758 A | 1/1993 | Oka et al. |
| 5,182,670 A | 1/1993 | Khan et al. |
| 5,187,717 A | 2/1993 | Horita et al. |
| 5,206,697 A | 4/1993 | Schwartz |
| 5,210,807 A | 5/1993 | Ames |
| 5,216,687 A | 6/1993 | Fujino et al. |
| 5,231,642 A | 7/1993 | Scifres et al. |
| 5,235,605 A | 8/1993 | Rines et al. |
| 5,274,649 A | 12/1993 | Hirayama et al. |
| 5,291,502 A | 3/1994 | Pezeshki et al. |
| 5,301,201 A | 4/1994 | Dutta et al. |
| 5,319,668 A | 6/1994 | Luecke |
| 5,325,392 A | 6/1994 | Tohmori et al. |
| 5,347,526 A | 9/1994 | Suzuki et al. |
| 5,351,256 A | 9/1994 | Schneider et al. |
| 5,357,532 A | 10/1994 | Aoshima et al. |
| 5,384,651 A | 1/1995 | Van de Voorde et al. |
| 5,414,726 A | 5/1995 | Raj et al. |
| 5,418,802 A | 5/1995 | Chwalek |
| 5,425,039 A | 6/1995 | Hsu et al. |
| 5,426,657 A | 6/1995 | Vakhshoori |
| 5,428,635 A | 6/1995 | Zhiglinsky et al. |
| 5,461,637 A | 10/1995 | Mooradian et al. |
| 5,485,014 A | 1/1996 | Jain et al. |
| 5,504,772 A | 4/1996 | Deacon et al. |
| 5,513,204 A * | 4/1996 | Jayaraman ................... 372/96 |
| 5,530,714 A | 6/1996 | Vilhelmsson et al. |
| 5,536,085 A | 7/1996 | Li et al. |
| 5,541,945 A | 7/1996 | Yamaguchi et al. |
| 5,568,311 A | 10/1996 | Matsumoto |
| 5,568,504 A | 10/1996 | Kock et al. |
| 5,581,572 A | 12/1996 | Delorme et al. |
| 5,623,359 A | 4/1997 | Giles et al. |
| 5,625,635 A | 4/1997 | Kurtz et al. |
| 5,627,853 A | 5/1997 | Mooradian et al. |
| 5,629,951 A | 5/1997 | Chang-Hasnain et al. |
| 5,631,736 A | 5/1997 | Thiel et al. |
| 5,652,812 A | 7/1997 | Gurib et al. |
| 5,671,243 A | 9/1997 | Yap |
| 5,680,411 A | 10/1997 | Ramdane et al. |
| 5,696,779 A | 12/1997 | Welch et al. |
| 5,708,669 A | 1/1998 | DiGiovanni et al. |
| 5,734,666 A | 3/1998 | Wada et al. |
| 5,754,578 A | 5/1998 | Jayaraman |
| 5,774,485 A | 6/1998 | Stein |
| 5,778,015 A | 7/1998 | Gunning et al. |
| 5,789,274 A | 8/1998 | Yamaguchi et al. |
| 5,793,787 A | 8/1998 | Meyer et al. |
| 5,796,771 A * | 8/1998 | DenBaars et al. ............. 372/75 |
| 5,812,567 A | 9/1998 | Jeon et al. |
| 5,835,512 A | 11/1998 | Wada et al. |
| 5,835,517 A | 11/1998 | Jayaraman et al. |
| 5,838,714 A | 11/1998 | Delorme |
| 5,841,799 A | 11/1998 | Hiroki |
| 5,889,801 A | 3/1999 | Kato et al. |
| 5,914,976 A | 6/1999 | Jayaraman et al. |
| 5,923,685 A | 7/1999 | Akagawa et al. |
| 5,936,981 A | 8/1999 | Wada et al. |
| 5,953,154 A | 9/1999 | Akagawa et al. |
| 5,963,576 A | 10/1999 | Claisse et al. |
| 5,966,234 A | 10/1999 | Ford et al. |
| 5,970,076 A | 10/1999 | Hamada |
| 5,976,905 A | 11/1999 | Cockerill et al. |
| 5,985,686 A | 11/1999 | Jayaraman |
| 5,991,326 A * | 11/1999 | Yuen et al. ................... 372/96 |
| 5,991,477 A | 11/1999 | Ishikawa et al. |
| 6,018,582 A | 1/2000 | Francois et al. |
| 6,026,100 A | 2/2000 | Maeda |
| 6,026,108 A | 2/2000 | Lim et al. |
| 6,054,335 A | 4/2000 | Sun et al. |
| 6,064,684 A | 5/2000 | Yoon et al. |
| 6,066,859 A | 5/2000 | Stegmueller |
| 6,097,742 A | 8/2000 | Caprara et al. |
| 6,104,739 A | 8/2000 | Hong et al. |
| 6,127,200 A | 10/2000 | Ohiso et al. |
| 6,151,340 A | 11/2000 | Rivers |
| 6,154,471 A | 11/2000 | Jin et al. |
| 6,167,068 A | 12/2000 | Caprara et al. |
| 6,181,717 B1 | 1/2001 | Kner et al. |
| 6,192,059 B1 | 2/2001 | Karioja et al. |
| 6,195,381 B1 | 2/2001 | Botez et al. |
| 6,252,896 B1 | 6/2001 | Tan et al. |
| 6,252,897 B1 | 6/2001 | Abe |
| 6,263,002 B1 | 7/2001 | Hsu et al. |
| 6,285,704 B1 | 9/2001 | Kullander-Sjoberg et al. |
| 6,320,539 B1 | 11/2001 | Matthews et al. |
| 6,324,192 B1 * | 11/2001 | Tayebati ...................... 372/20 |
| 6,324,193 B1 | 11/2001 | Bourzeix et al. |
| 6,330,253 B1 | 12/2001 | Tuganov et al. |
| 6,339,607 B1 * | 1/2002 | Jiang et al. ................... 372/50 |
| 6,347,108 B2 * | 2/2002 | Jiang et al. ................... 372/50 |
| 6,366,597 B1 | 4/2002 | Yuen et al. |
| 6,373,867 B1 | 4/2002 | Lin et al. |
| 6,424,669 B1 * | 7/2002 | Jiang et al. ................... 372/50 |
| 6,438,149 B1 * | 8/2002 | Tayebati et al. .............. 372/45 |
| 6,507,593 B1 * | 1/2003 | Spinelli et al. ............... 372/20 |

OTHER PUBLICATIONS

Richard Dorf, The Electrical Engineering Handbook, Chapter 47, Ferroelectric and Piezoelectric Materials, p. 1087–1097, CRC Press, Inc., Florida, 1993.

Douglas Considine, Van Nostrand's Scientific Encyclopedia, 5th Edition, p. 1778, Litton Educational Publishing, Inc. 1976.

* cited by examiner

METHOD AND APPARATUS FOR WAVELENGTH TUNING OF OPTICALLY PUMPED VERTICAL CAVITY SURFACE EMITTING LASERS

CROSS REFERENCE TO RELATED APPLICATIONS

This application is related to U.S. application Ser. No. 09/430,570, Attorney Docket No. 003918.P005, filed Oct. 29, 1999 by inventors Wenbin Jiang et al, the disclosure of which is hereby incorporated by reference, verbatim and with the same effect as though it were fully and completely set forth herein.

FIELD OF THE INVENTION

The invention relates generally to semiconductor lasers. More particularly, the invention relates to tuning the wavelength of output photons in optically pumped semiconductor lasers.

BACKGROUND OF THE INVENTION

Semiconductor lasers have become more important. One of the most important applications of semiconductor lasers is in communication systems where fiber optic communication media is employed. With growth in electronic communication, communication speed has become more important in order to increase data bandwidth in electronic communication systems. Improved semiconductor lasers can play a vital roll in increasing data bandwidth in communication systems using fiber optic communication media such as local area networks (LANs), metropolitan area networks (MANs) and wide area networks (WANs). A preferred component for optical interconnection of electronic components and systems via optical fibers is a semiconductor laser known as a vertical cavity surface emitting laser (VCSEL). The current state of design and operation of VCSELs is well known. Due to optical properties of optical fibers, photons emitted at longer wavelengths from a laser tend to propagate longer distances due to lower loss and smaller dispersion. Thus, forming a VCSEL that can operate at longer wavelengths, such as a wavelength greater than 1.25 $\mu$m, is desirable.

Lasers can be excited or pumped in a number of ways. Typically, VCSELs have been electrically excited (electrically pumped) by a power supply in order to stimulate photon emission. However, achieving photon emission at long wavelengths using electrical pumping has not been commercially successful due to a number of disadvantages.

Figure 1:
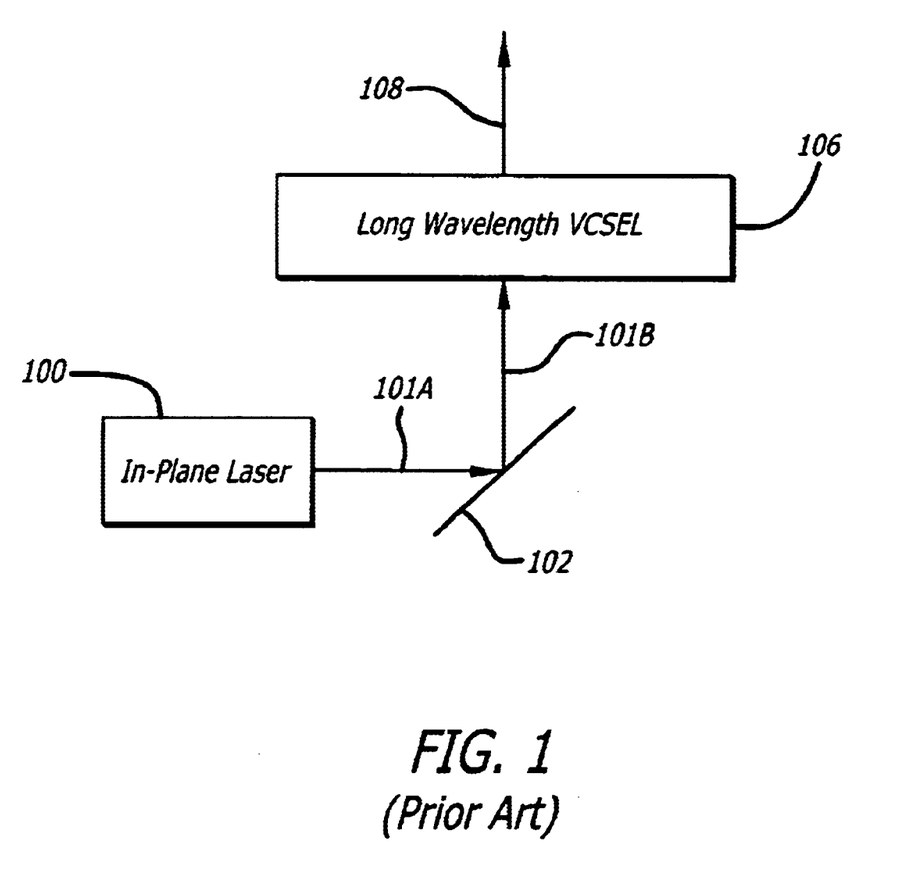
FIG. 1 is a block diagram of a prior art system of optically pumping a long wavelength VCSEL.

More recently it has been shown that a VCSEL can be optically excited (optically pumped) to stimulate photon emission. Referring now to FIG. 1, it has been shown that an in-plane laser 100 can have its emitted photons 101A redirected by a mirror 102 into the direction of photons 101B for coupling into a VCSEL 106. The in-plane laser 100 is designed to be electrically excited in order to emit photons 101A at relatively short wavelengths (850 nanometers (nm) to 980 nanometers (nm)). The redirected photons 101B from the in-plane laser 100 optically excite the VCSEL 106. The VCSEL 106 is designed to be optically excited in order to emit photons 108 at relatively long wavelengths (1250 nm to 1800 nm). A disadvantage to the system of FIG. 1 is that the wavelength for the photons emitted by the VCSEL 106 are not tunable. Typically, the long wavelength of the output photons is designed to a predetermined value by the materials selected in forming the VCSEL 106.

Wavelength tunable lasers are important for dense wavelength division multiplexed (DWDM) applications where a semiconductor laser wavelength has to comply with an International Telecommunications Union (ITU) wavelength grid. Using a distributed feedback (DFB) laser formed to generate photons near the wavelength of interest, a conventional method to fine-tune the wavelength of the laser is to control the laser operation temperature. In order to generate wavelengths of photons over the whole range of the ITU wavelength grid, many DFB lasers formed to generate different wavelengths can be used and multiplexed together. However, due to the large number of lasers involved, the system complexity is rather high and stocking the entire range of lasers for replacement is bothersome.

Another means to tune the wavelength of a DFB laser is to use sampled grating technology. One problem associated with using sampled grating technology is that device yields can be low due to the grating complexity. Additionally, the control electronics for tuning the wavelength of a DFB laser using sampled grating technology can be complicated. Additionally, the coupling efficiency of the photons generated by DFB lasers into a single mode fiber is typically low due to a spatial mismatch between the DFB's output laser beam and the fiber core of a single mode optical fiber.

Because long wavelength VCSELs can have a circular beam profile, the coupling efficiency into an optical fiber can be superior to a DFB laser. Thus if the wavelength of photons output by a long wavelength VCSEL can be tuned, greater advantages can be achieved over that of a tunable DFB laser.

One way that a long wavelength VCSEL may be tunable is through the application of Microelectromechanical Systems (MEMS) film technology. MEMS film technology involves forming an MEMS film directly onto the VCSEL. One drawback to using MEMS technology is that MEMS film is rather fragile and may be destroyed. Additionally, MEMS film is sensitive to mechanical vibrations and vibrations induced by noise. Furthermore, yields of devices incorporating MEMS technology are typically low.

It is desirable to overcome the limitations of the prior art.

DETAILED DESCRIPTION OF THE PREFERRED EMBODIMENT

In the following detailed description of the invention, numerous specific details are set forth in order to provide a thorough understanding of the invention. However as one skilled in the art will recognize, the invention may be practiced without these specific details. In other instances well known methods, procedures, components, and circuits have not been described in detail so as not to unnecessarily obscure aspects of the invention.

The tunability in the invention is provided by varying a gap distance D of a gap within a resonant cavity of an optically pumped vertical cavity surface emitting laser (VCSEL). The gap in one embodiment is an air gap (i.e., a free space gap) but can just as well be filled with certain materials, such as polymer materials. By varying the resonant cavity of the laser, the wavelength of output photons can be tuned around a center wavelength for which the laser was designed similar to tuning to a carrier frequency of a communications channel from an oscillating frequency.

In first and second embodiments, a submount is provided to which a portion of the optically pumped vertical cavity surface emitting laser (VCSEL) and an electrically pumped semiconductor laser are coupled and separated. A second distributed Bragg reflector (DBR) for the laser cavity of the optically pumped vertical cavity surface emitting laser (VCSEL) is coupled to the electrically pumped semiconductor laser forming an air gap there between. The electrically pumped semiconductor laser and the optically pumped VCSEL are aligned such that the laser output of the electrically pumped semiconductor laser can stimulate emissions by the optically pumped laser. The gap distance of the air gap in the cavity of the optically pumped VCSEL is varied to vary the wavelength generated by the long wavelength VCSEL. The submount is formed out of a piezo-electric material such that when a voltage is applied across it, the crystals are aligned so that the length of the piezo-electric material varies. Variances in the length of the piezo-electric material accordingly varies the distance of the air gap and the wavelength of the photons generated by the optically pumped VCSEL. The submount may be a lever-arm or cantilever type system or a lifting type system to generate the variance in the gap. One or more openings are provided in the submount system so that photons can pass through undisturbed by it. In one embodiment, a folded cavity surface emitting laser (FCSEL) is the electrically pumped semiconductor laser that is used to generate the pump source of photons. Typically, the wavelength of photons of the pump source is 850 nanometers or 980 nanometers to generate a relatively long wavelength from 1250 to 1700 nanometers.

In third and fourth embodiments, the pump source of photons from a laser is provided to the optically pumped VCSEL through an optical fiber. A submount to which the optical fiber and the optically pumped VCSEL are coupled provides separation between a coating at the end of the optical fiber and the material layers of the optically pumped VCSEL generating an air gap in a resonant cavity of the long wavelength VCSEL. The submount is a piezo-electric subassembly, including a piezo-electric material, such that when a voltage is applied, its length varies as does the gap distance of the air gap and the wavelength of the photons generated by the optically pumped VCSEL.

Figure 2A:
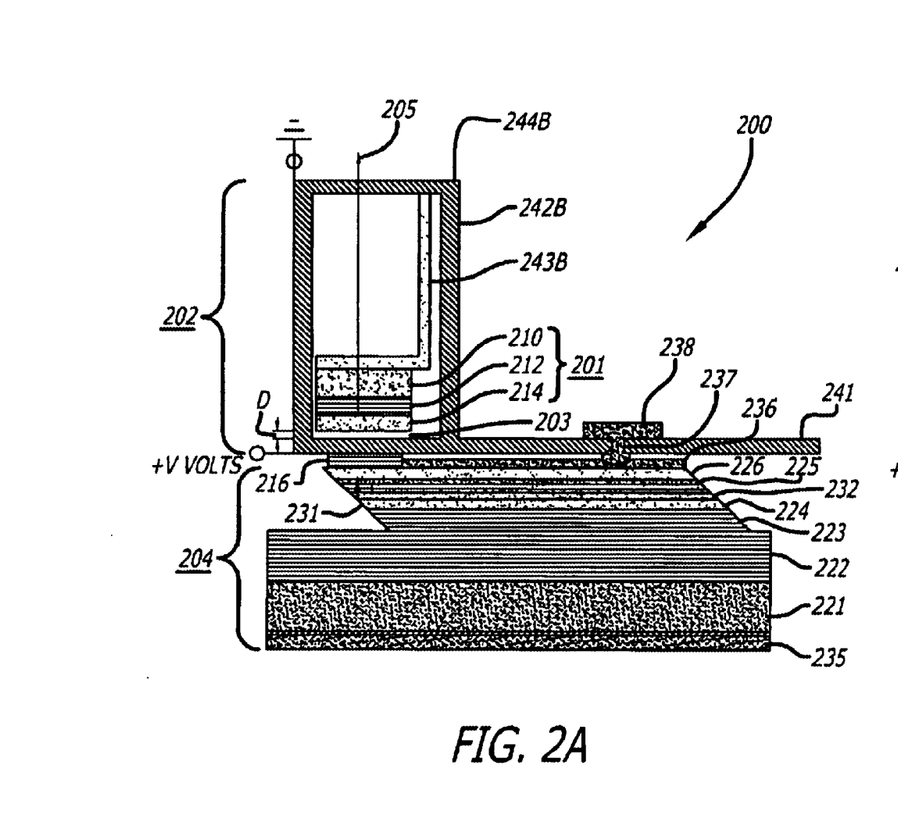
FIG. 2A is a side view of a first embodiment of a tunable long wavelength VCSEL of the invention with a cutaway showing the optically pumped long wavelength VCSEL.
Figure 2B:
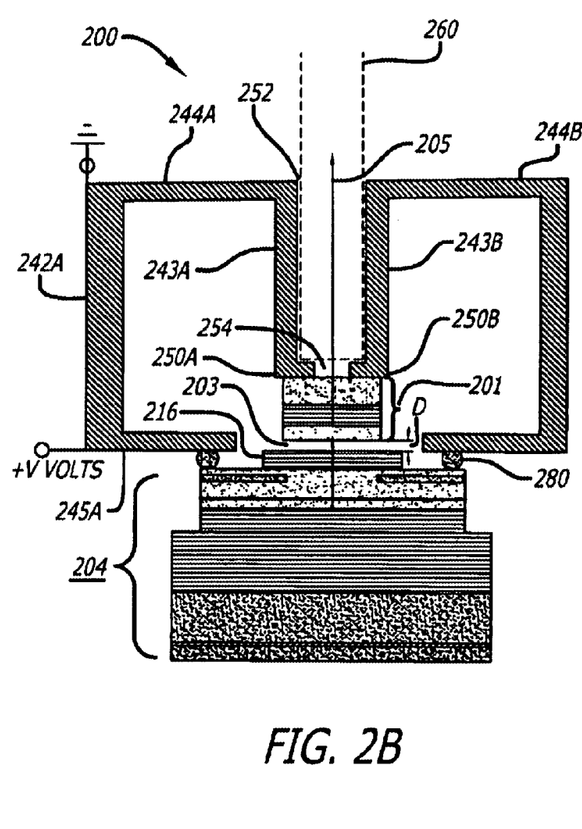
FIG. 2B is a cross sectional frontal view of the first embodiment of the tunable long wavelength VCSEL of the invention.

Referring now to FIG. 2A, a side view of a tunable long wavelength semiconductor laser 200 is illustrated. The tunable long wavelength semiconductor laser 200 includes an optically pumped vertical cavity surface emitting laser (VCSEL) 201, a piezo-electric subassembly 202, an air gap 203, and an electrically pumped semiconductor laser 204 coupled together as shown in FIGS. 2A–2B. The air gap 203 forms part of a resonant cavity for the optically pumped vertical cavity surface emitting laser (VCSEL) 201. In one embodiment, the air gap 203 is a free space air gap but in alternate embodiments, the air gap 203 can be filed with certain materials, such as polymer materials. The distance of separation in the air gap 203 is referred to as the gap distance D. The gap distance D may also be referred to as a separation distance or gap separation.

The gap distance D may be altered by changing the voltage applied to the piezo-electric subassembly. A change in the gap distance D changes the resonance of the laser cavity of the long wavelength optically pumped VCSEL 201 and therefore changes the wavelength of the photons that are generated by it. Depending upon how the lasers are mounted, increasing the voltage to the piezo-electric subassembly 202 increases the gap distance D in the air gap 203 in one embodiment to increase the wavelength of the photons generated by the optically pumped VCSEL 201. In another embodiment, increasing the voltage applied across the piezo-electric subassembly 202 decreases the gap distance D in the air gap 203 to decrease the wavelength of the photons generated by the optically pumped VCSEL 201.

The electrically pumped semiconductor laser 204 (also referred to as an "electrically pumped short wavelength semiconductor laser" or "pump laser" is designed to operate at relatively short wavelengths (from 770 nanometers (nm) to 1480 nanometers (nm)) and the optically pumped VCSEL 201 (also referred to as an "optically pumped long wavelength VCSEL) is designed to operate at relatively long wavelengths (from 1250 nm to 1700 nm). In one embodiment, the electrically pumped semiconductor laser 204 operates at 850 nm while the optically pumped VCSEL 201 is designed to operate at 1310 nm or 1550 nm with wavelength tuning range provided by the invention at around 100 nm or less. In another embodiment, the electrically pumped semiconductor laser 204 operates at 980 nm while the optically pumped VCSEL 201 is designed to operate at 1310 nm or 1550 nm with wavelength-tuning range provided by the invention at around 100 nm or less. In yet another embodiment, the electrically pumped semiconductor laser 204 operates at 1480 nm while the optically pumped VCSEL 201 is designed to operate at 1550 nm with wavelength tuning range provided by the invention at around 100 nm or less. The range of wavelength tuning provided around the center wavelength is plus or minus fifty nanometers (+/−50 nm) in one embodiment. The range of wavelength tuning can be more or less depending upon the design of the frame for the piezo-electric subassembly 202 and the available voltage that can be applied across it. The long wavelength optically pumped VCSEL 201 operates by being optically pumped by the short wavelength semiconductor laser 204 which is electrically pumped.

The electrically pumped semiconductor laser 204 can be a number of types capable of providing a gap between it and the optically pumped VCSEL 201. The electrically pumped semiconductor laser 204 illustrated in FIG. 2A is a folded cavity surface emitting laser (FCSEL). FCSELs were previously described in greater detail in the related U.S. patent application Ser. No. 09/430,570 which has been incorporated herein by reference. Alternatively, the electrically pumped semiconductor laser 204 can be a horizontal cavity surface emitting laser or a vertical cavity surface emitting laser (VCSEL). In exemplary embodiments, the electrically pumped semiconductor laser 204 is a multimode semiconductor laser designed to operate at 850 nm or 980 nm.

The long wavelength optically pumped VCSEL 201 has its resonance cavity spread across the air gap 203. The long wavelength optically pumped VCSEL 201 includes a substrate 210, a first distributed Bragg reflector (DBR) mirror 212 and an active area or region 214 coupled together as shown in FIG. 2A on one side of the air gap 203. The elements of the long wavelength optically pumped VCSEL 201 can be monolithically grown together or deposited layer on top of layer starting from the substrate layer 210 depending upon the type of materials utilized. The active region 214 is grown or bonded onto the first DBR mirror 212. A second DBR mirror 216, to complete the resonant cavity of the long wavelength optically pumped VCSEL 201, is grown or deposited onto the short wavelength pump laser 204 on the opposite side of the air gap 203. This makes the air gap 203 a part of the resonant cavity of the long wavelength optically pumped VCSEL 201. Thus, variances in the gap distance D of the air gap 203 alters the resonant cavity of the long wavelength optically pumped VCSEL 201.

The first DBR 212 coupled to the active region 214 can be a Gallium-Arsenide/Aluminum-Gallium-Arsenide (GaAs/AlGaAs) DBR, an Indium-Phosphide/Indium-Gallium-Arsenide-Phosphide (InP/InGaAsP) DBR, or a dielectric DBR and formed of pairs of material layers accordingly. The active region 214 can be InGaAsN, InGaAsP or an Indium-Aluminum-Gallium-Arsenide (InAlGaAs) quantum well structure having one or more quantum wells. The substrate 210 of the long wavelength VCSEL 201 can be a GaAs or an InP substrate. The second DBR 216 coupled to the short wavelength pump laser 204 can be a GaAs/AlGaAs DBR, a InGaAsP/InP DBR, or a dielectric DBR and formed of pairs of material layers accordingly. DBRs 212 and 216 are made of thicknesses to provide substantial (preferably 99% or more) reflection of long wavelengths around 1.3 um or 1.55 um to amplify and stimulate emission.

The pump laser 204 in the embodiment illustrated in FIG. 2A is a folding cavity surface emitting laser (FCSEL) 204 which includes an n-type doped GaAs substrate 221, a distributed Bragg reflector (DBR) 222, an active area or region 224, and a cladding layer 226 with an oxide ridge. The substrate 221 is one embodiment is GaAs. The layers of the DBR 222 may be formed from n-type $Al_xGa_{1-x}As/Al_yGa_{1-y}As$ pairs of material with x ranging from 0 and 0.5, and y ranging from 0.5 and 1, and have between five to twenty five pairs. Typically, ten pairs of material layers are provided in the DBR 222. The active region 224 can be GaAs, AlGaAs, or InGaAs quantum well structure with a single quantum well or multiple quantum wells. Typically, three to nine quantum wells may be utilized in the active region 224. The cladding layer 226 is a p-type GaAs or AlGaAs. The cladding layer 226 includes an oxide ridge 225 which provides confinement in current injection for the FCSEL 204. The oxide ridge 225 is formed by oxidizing a portion of an Aluminum-Arsenide (AlAs) layer or an Aluminum-Gallium-Arsenide (AlGaAs) layer with very high Aluminum content into an Aluminum-Oxide ($Al_2O_3$) region.

The active region 224, the cladding 226, and a portion 223 of the DBR 222 have an external-angled beam steering element 232 and an internal-angled beam steering element 231 etched in their materials. Preferably the external-angled beam steering element 232 and the internal-angled beam steering element 231 are approximately forty five degree angles with the incident light and form the folded cavity of the folded cavity surface emitting laser 204.

The FCSEL 204 further includes a first electrode 235 coupled to the substrate 221 and a second electrode 236 coupled to the top of the cladding layer 226. The first and second electrodes 235 and 236 provide electrical connections to electrically pump the FCSEL 204. The piezo-electric submount 202 provides a through-hole 237 through which a via connection can be made to a bonding pad 238. The bonding pad 238 provides for wire bonding to a terminal of a TO can or a DIL (Dual in line) package.

Although the short wavelength semiconductor laser, also referred to as the pump laser, can be multimode either longitudinally or transversely, the output from the long wavelength VCSEL is single mode longitudinally. The output from the long wavelength VCSEL can be single mode transversely depending upon the geometric integration scheme and patterning. In coupling with a single mode optical fiber, it is preferred that the long wavelength VCSEL operate in a single transverse mode to optimally couple thereto. Modulation of the long wavelength VCSEL 201 can be achieved through either direct electrical modulation of the short wavelength pump laser 204 or through external modulation using an external modulator, such as an EL modulator.

The piezo-electric sub-assembly 202 is formed as illustrated to provide a submount for the short wavelength pump laser 204 and the long wavelength optically pumped VCSEL 201. The piezo-electric sub-assembly 202 is also referred to herein as a piezo-electric submount. The piezo-electric sub-assembly is formed out of a piezo-electric material such as a ceramic, a crystal, or organic material. A piezo-electric material has a piezo-electric effect. That is, a piezo-electric material generates an electrical output when subjected to mechanical stresses. Conversely, a piezo-electric material when subject to an electric field (i.e., a voltage) undergoes a mechanical deformity. While the piezo-electric sub-assembly 202 is illustrated as being rectangularly shaped in FIGS. 2A–2C, it can take on other cylindrical shapes such as a circular cylinder.

The piezo-electric submount 202 in one embodiment is formed out of a lead zirconite-titanate (PZT), a ceramic, but can be formed out of other piezo-electric materials such as the crystal materials of quartz, barium titanate, rochelle salt, or lithium niobate ($LiNbO_3$); or the ceramic materials PLZT or PMN; or the organic material PVF2. In the case of a PZT material, it can be cut, milled or otherwise shaped similarly to other ceramic materials into the frame of the piezo-electric sub-assembly 202.

Referring to FIG. 2A, the frame of the piezo-electric submount 202 includes a base 241 and then splits into two frames around the long wavelength VCSEL 201. In FIG. 2A one of the two splits of the frame are illustrated including a first top portion 244B, a first external side portion 242B, and a first inner support portion 243B viewable through the cutaway portion.

Referring now to FIG. 2B, the two splits in the frame of the piezo-electric submount 202 are more clearly visible. The first split of the frame includes the first top portion 244B, the first external side portion 242B, the first inner support portion 243B, a first mounting foot 250B, and a first lower portion 245B. The second split of the frame includes a second top portion 244A, a second external side portion 242A, a second inner support portion 243A, a second mounting foot 250A, and a second lower portion 245A. There is space between the splits in the frame forming a fiber opening 252 and a beam opening 254. An optical fiber 260 may be slid into the fiber opening 252 to receive the laser beam 205 from the tunable long wavelength VCSEL 201. The first and second lower portions 245A and 245B of the piezo-electric submount 202 can couple directly to the top of the pump laser 204 or alternatively to a pair of contact rods 280 which may be part of the second electrode 236 to make an electrical contact thereto.

Figure 2C:
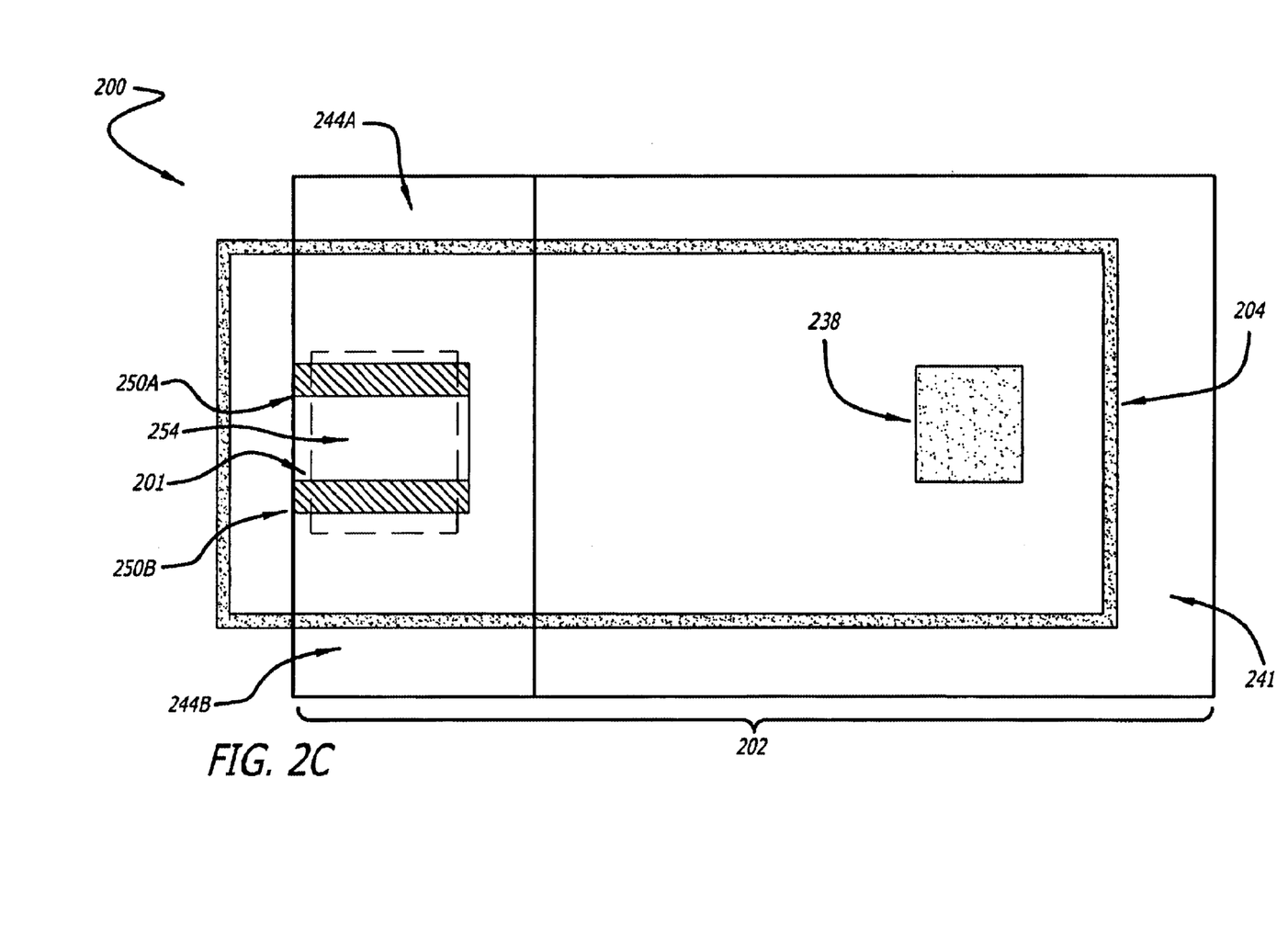
FIG. 2C is a top view of the first embodiment of the tunable long wavelength VCSEL of the invention.

Referring now to FIG. 2C, a top view of the tunable long wavelength semiconductor laser 200 is illustrated. FIG. 2 better illustrates the alignment and coupling between the piezo-electric submount 202, the optically pumped long wavelength VCSEL 201, and the electrically pumped pump laser 204. The first mounting foot 250B and the second mounting foot 250A couple to the optically pumped long wavelength VCSEL 201 to hold it in alignment over the second DBR 216 coupled to the electrically pumped pump laser 204. The beam opening 254 between the first second mounting foot 250B and the second mounting foot 250A allow the laser beam of photons from the long wavelength VCSEL 201 to pass through. The frame portions of the second inner support portion 243A, the second top portion 244A, and the second external side portion 242A on one split portion and the first inner support portion 243B, the first top portion 244B, and the first external side portion 242B on the other split portion of the frame, suspend the optically pumped long wavelength VCSEL 201 away from the second DBR 216 and the electrically pumped pump laser 204 to form the air gap 203. When a voltage is applied across the piezo-electric submount 202, the first external side portion 242B and second external side portion 242A undergo mechanical stress to alter the gap distance D in the air gap 203.

Contacts are made to the first and second top portions 244A–244B and the first and second lower portions 245A–245B and/or the base 241 of the piezo-electric submount 202 for applying a voltage across it. The voltage applied across the piezo-electric subassembly 202 in one embodiment can be in a range from zero to five hundred volts (0–500 V) in order to alter the gap distance D. In other embodiments, the voltage range can be more or less than 0–500 V.

The pump laser 204 and the optically pumped VCSEL 201 are mounted separately onto ends of the piezo-electric submount 202 facing each other and in alignment so that the electrically pumped short wavelength laser 204 can optically pump the long wavelength VCSEL 201. Joining the optically pumped VCSEL 201, the piezo-electric subassembly 202 and the electrically pumped semiconductor laser 204 together as a unit may be performed through semiconductor bonding methods such atomic bonding, wafer bonding, metal bonding, epoxy gluing or other well known semiconductor bonding techniques.

In operation, the short wavelength semiconductor laser 204 is electrically pumped to generate photons of a relatively short wavelength for coupling into the long wavelength VCSEL 201 through the air gap 203. When electrically stimulated, the folded cavity surface emitting laser 204 generates a short wavelength laser beam which is reflected between the beam steering element 231, beam steering element 232, DBR 223, and the top surface of cladding 226.

An in-plane laser beam is reflected by beam steering element 231 into a substantially perpendicular beam for coupling into the long wavelength VCSEL 201 to optically pump it. The photons generated by the pump laser 204 stimulate the long wavelength VCSEL 201 to generate photons of a relatively long wavelength. After becoming sufficiently pumped to reach lasing threshold, the long wavelength VCSEL 201 emits the long wavelength laser beam 205. The long wavelength laser beam 205 is transmitted through the long wavelength VCSEL substrate 210 for coupling into an optical fiber (not shown in FIG. 2A). A voltage V can be applied across the piezo-electric subassembly to vary the gap distance D of the air gap 203 and tune the wavelength of the photons generated by the optically pumped long wavelength VCSEL 202. The variances in the gap distance D modifies the resonant cavity of the optically pumped long wavelength VCSEL 202 so as to tune the long wavelength laser beam.

Figure 3:
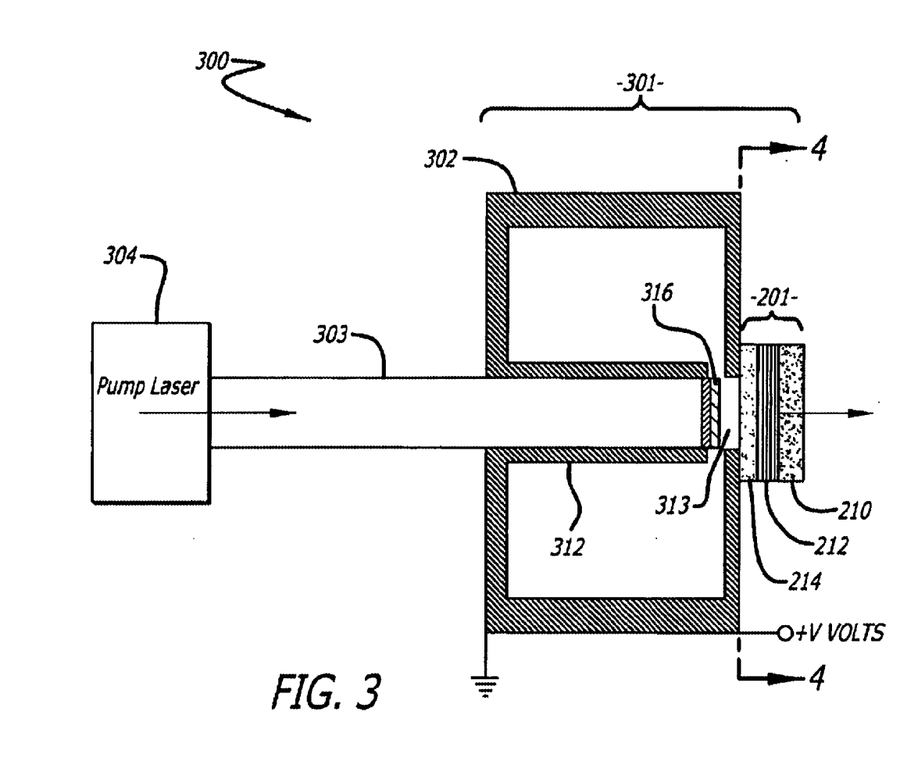
FIG. 3 is a cross sectional side view of a second embodiment of a tunable long wavelength VCSEL of the invention and a system incorporating the same.

FIG. 3 illustrates a side view of an alternative embodiment of the invention. FIG. 3 illustrates a tunable laser system 300 including a long wavelength optically pumped VCSEL 201, a piezo-electric subassembly 302, an optical fiber 303, and a pump laser 304. The long wavelength optically pumped VCSEL 201, the piezo-electric subassembly 302, and the optical fiber 303 near an end are coupled together as shown in FIG. 3 as a tunable long wavelength VCSEL 301.

The pump laser 304 can be located near or away from the tunable long wavelength optically pumped VCSEL and/or located in the vicinity of the other optical, electrical or opto-electronic components. The pump laser 304 generates a pump source of relatively short wavelength photons which are coupled into the optical fiber 303 in order to excite the long wavelength VCSEL 201. The pump laser 304 can be any laser generating photons at a relatively short wavelength which is less than the desired long wavelength including, a high power conventional semiconductor laser generating photons at relatively short wavelength at (e.g., 850 nm, 980 nm/1480 nm) which is less than the desired long wavelength of photons (e.g., 1300 nm/1500 nm) for which the long wavelength VCSEL 201 is designed to produce.

The piezo-electric subassembly 302 is a frame of piezo-electric material which is cylindrically shaped. In one embodiment the frame of the piezo-electric subassembly 302 is shaped similar to a tubeless tire or a donut with a piezo-electric sleeve 312 position around its center line to receive the optical fiber 303. The piezo-electric sleeve 312 is cylindrically shaped as well and extends from a top portion of the piezo-electric subassembly 302. Electrical contacts are made on opposite sides or ends of the piezo-electric subassembly 302 to provide terminals through which a voltage can be applied across it at opposite sides or ends.

The length of the piezo-electric subassembly 302 is provided to get an appropriate amount of change in the gap distance for a given range of voltage across the piezo-electric subassembly 302. The desired range of wavelength tunability, around the center wavelength designed into the long wavelength VCSEL 201, determines the amount of variance needed in the resonant cavity and the gap distance D. For a given applied voltage, the piezo-electric subassembly 302 may need to be made longer to effectuate greater movement in the gap distance D.

Figure 4:
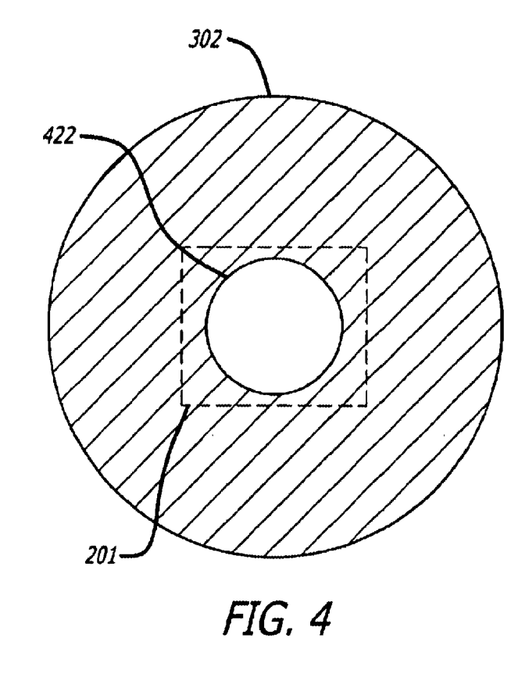
FIG. 4 is a cross sectional top view of the submount illustrated in FIGS. 3 and 5.

Referring now to FIG. 4, a cross-sectional view of the piezo-electric subassembly 302 is illustrated. The piezo-electric subassembly 302 illustrated in FIG. 4 is a circular cylinder shape. However, other cylindrical shapes can be used including rectangular, hexagonal, octagonal or square. As illustrated in FIG. 4, the long wavelength VCSEL 201 has its center in line with the center of the cylindrically shaped piezo-electric subassembly 302. The opening 422 in the piezo-electric subassembly 302 allows photons to resonate back and forth between the dielectric coating on the tip of the optical fiber and the long wavelength VCSEL 201.

The optical fiber can be either a single mode or multimode optical fiber. The tip of the optical fiber 303 has a reflective mirror 316 coupled to it. In one embodiment, the reflective mirror 316 is a highly reflective dielectric coating which is reflective at the long wavelength of interest, such as 1300 nm or 1550 nm. Alternatively, the reflective mirror 316 can be an independent reflective DBR, such as a dielectric BR, coupled to the tip of the optical fiber 303. The optical fiber 303 is slid into the piezo-electric sleeve 312 such that an air gap 313 is formed between the mirror 316 and the active region 214 of the long wavelength VCSEL 201.

The system 300 forms an air gap 313 between the mirror 316 at the tip of the optical fiber 303 and the long wavelength VCSEL 201. By applying a voltage across the piezo-electric subassembly, a gap distance D in the air gap 313 can be varied. Varying the gap distance D in the air gap 313 alters a resonant cavity of the long wavelength VCSEL 201 in order to tune the long wavelength VCSEL 201.

The long wavelength VCSEL 210 is mounted so that its active region 214 couples to a bottom side of the piezo-electric subassembly 302 in alignment with the optical axis of the optical fiber 303 to receive photons there from. The layers of the long wavelength VCSEL 201 are described previously in greater detail with reference to FIG. 1A. The long wavelength VCSEL 201 includes a DBR 212 coupled to the active region 214 as illustrated. The active region 214 faces the mirror 316 on the tip of the optical fiber. The laser beam of photons of generated by the long wavelength VCSEL 201 is coupled out through its substrate 210 as shown in FIG. 3.

The resonant cavity for the tunable long wavelength optically pumped VCSEL 301 consists of the mirror 316 at one end and the DBR 212 at an opposite end with the air gap 313 and the active region 214 there between. The gap distance D of the air gap 313 can be adjusted by tuning the piezo-electric subassembly 302, and thus the wavelength of the long wavelength VCSEL. That is by applying a voltage V across the piezo-electric subassembly 302 its frame can be altered such that the gap distance D of the air gap 313 can vary and adjust the resonant cavity of the long wavelength VCSEL 201. The piezo-electric subassembly 302 can be designed to provide on the order of plus or minus fifty nanometers (+/−100 nm) depending upon the voltage around the center long wavelength of the long wavelength VCSEL 201. If additional variation is desired, a larger piezo-electric subassembly 302 can be formed.

Figure 5:
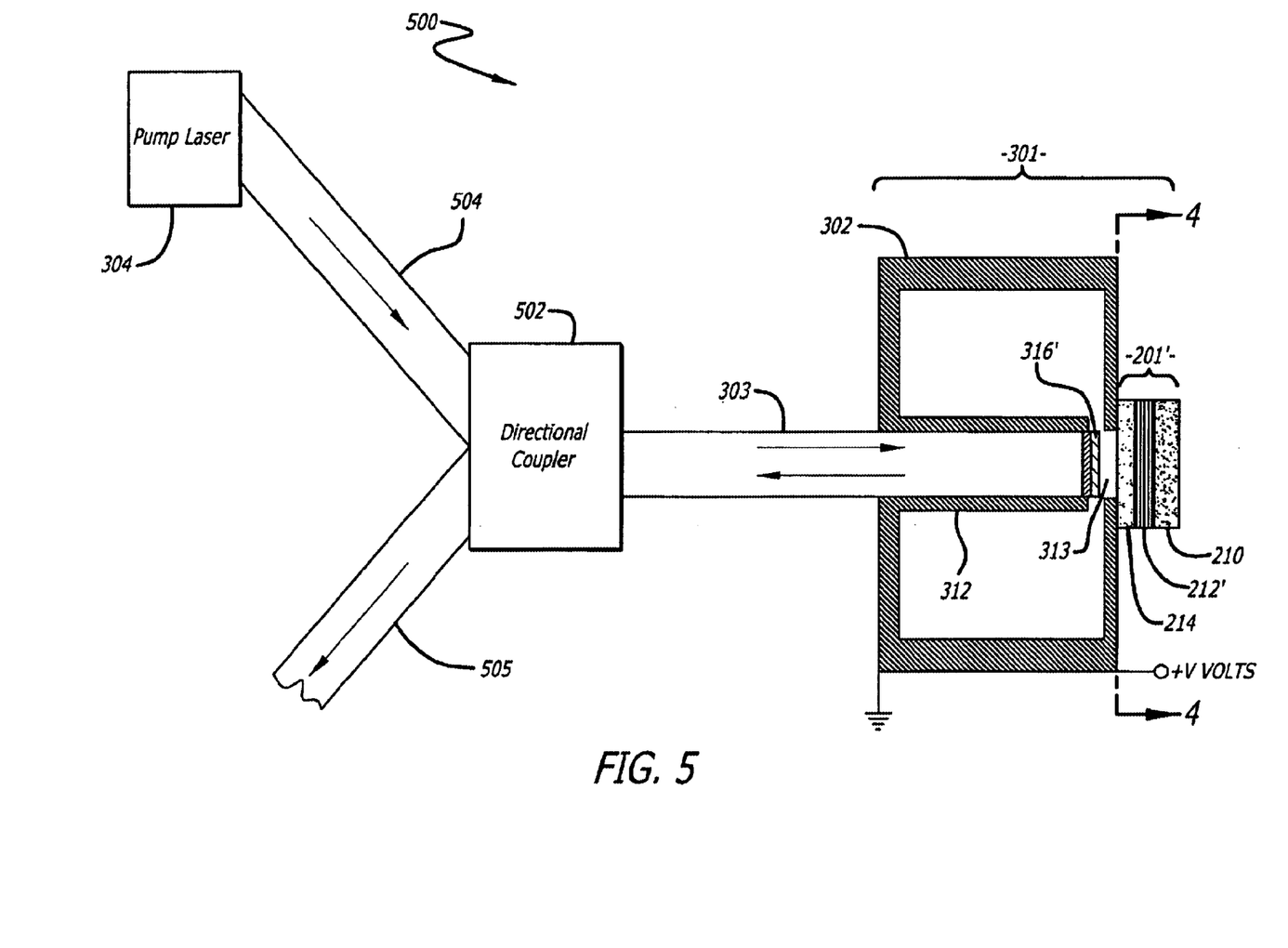
FIG. 5 is a cross sectional side view of alternate embodiment of a system for the tunable long wavelength VCSEL of the invention.

FIG. 5 is yet another embodiment of the invention. FIG. 5 illustrates a tunable laser system 500 somewhat similar to the system 300 previously discussed. The system 500 includes a tunable long wavelength optically pumped VCSEL 301' which includes a long wavelength optically pumped VCSEL 201' and the piezo-electric subassembly 302 and the optical fiber 303 with a mirror 316' at its tip and the air gap 313. The long wavelength optically pumped VCSEL 201' includes an active region 214, a DBR mirror 212', and a substrate 210. The system 500 further includes the pump laser 304 and a directional coupler 502. An optical fiber 504 may be used to couple the pump laser 304 and the directional coupler 502 together. Alternatively, the pump laser and the direction coupler 502 may be formed as a unit together without the separation provided by the optical fiber 504. An optical fiber 505 provides the output photons at the tuned long wavelength generated by the tunable long wavelength optically pumped VCSEL subassembly.

In the system 500, the output power from the long wavelength VCSEL 201 power couples back into the optical fiber 303 which also provides the pump source of photons. In this case, the DBR mirror 212' of the system 500 has greater reflectivity than the DBR mirror 212 of the system 300 and the mirror 316' of the system 500 has slightly less reflectivity than that of mirror 316 of the system 300. So in one direction of the optical fiber 303, a pump source of photons at a relatively short wavelength are being provided while in an opposite direction, photons of a relative long wavelength are being transmitted out from the long wavelength VCSEL 201. The directional coupler 502, or alternatively a splitter or a multiplexer, can be used to separate the photons in the optical fiber 303 into the photons of the outgoing long wavelength laser beam onto the optical fiber 505 from the incoming pump source of photons over the optical fiber 504.

In one embodiment, the reflective mirror 316' is a highly reflective dielectric coating which is reflective at the long wavelength of interest, such as 1300 nm or 1550 nm. Alternatively, the reflective mirror 316' can be an independent reflective DBR, such as a dielectric DBR, coupled to the tip of the optical fiber 303. The DBR mirror 212' coupled to the active region 214 can be a Gallium-Arsenide/Aluminum-Gallium-Arsenide (GaAs/AlGaAs) DBR, an Indium-Phosphide/Indium-Gallium-Arsenide-Phosphide (InP/InGaAsP) DBR, or a dielectric DBR and formed of pairs of material layers accordingly.

Figure 6:
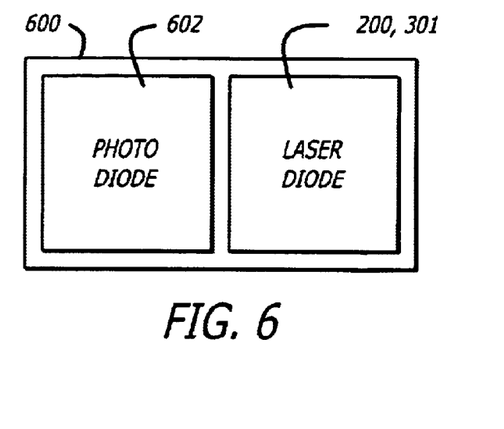
FIG. 6 illustrates a substrate including the tunable long wavelength VCSEL laser diode of the invention and a photo diode.

Referring now to FIG. 6, a substrate 600 includes the tunable optically pumped VCSELs (i.e. a laser diode) of the invention (such as 200 and 301) and a photo diode 602 are illustrated. The photo diode 602 is used to monitor the power output of the VCSEL. Exemplary embodiments of the photo diode 602 are a PN photo diode an a PIN photo diode.

Figure 7:
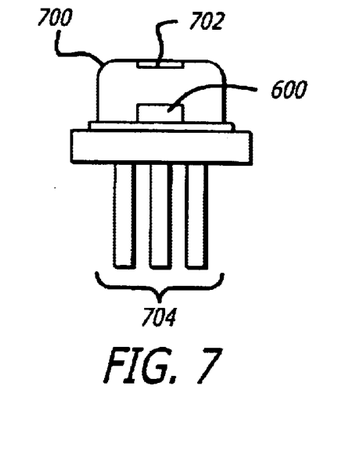
FIG. 7 illustrates a cross sectional view of a packaged laser diode transmitter including the tunable laser diode of the invention.

Referring now to FIG. 7, a packaged laser diode transmitter 700 is illustrated. The packaged laser diode transmitter 700 includes a substrate 600, a window 702, and on or more pins or an electrical connector 704. The substrate 600 includes one of the VCSELs of the invention. The substrate 600 may also include a photo diode to monitor the power output of the laser diode. The window 702 allows the photons or light generated by the VCSEL to be emitted from the package. The window 702 can also provide for a partial reflection of the photons or light down to the photo diode for output power measurement.

Figure 8:
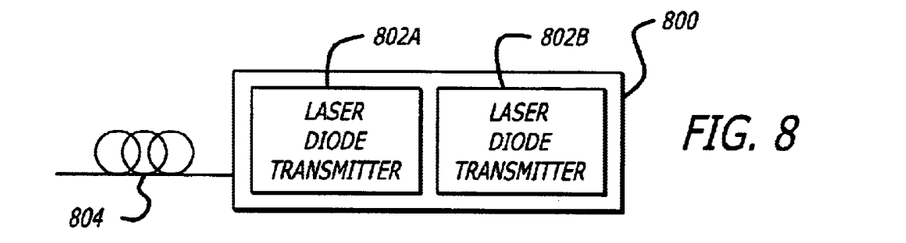
FIG. 8 illustrates an optoelectronic module incorporating the tunable laser diode of the invention.

Referring now to FIG. 8, an optoelectronic module 800 is illustrated. The optoelectronic module 800 includes one or more laser diode transmitters 802A and 802B. The optoelectronic module 800 couples to one or more optical fibers 804. The one or more laser diode transmitters 802A and 802B, include the optical subassembly having the tunable optically pumped VCSEL of the invention.

Figure 9:
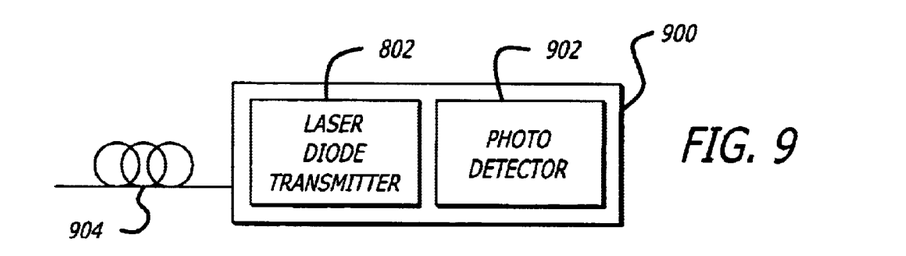
FIG. 9 illustrates another optoelectronic module incorporating the tunable laser diode of the invention.

Referring now to FIG. 9, an optoelectronic module 900 is illustrated. The optoelectronic module 900 includes one or more laser diode transmitters 802 and one or more photo-detectors 902. The optoelectronic module 900 couples to one or more optical fibers 904. The one or more laser diode transmitters 802, include the optical subassembly having the tunable optically pumped VCSEL of the invention.

An optoelectronic module can also referred to as a fiber channel module, an FDDI module, a fiber optic module, a fiber optic modem, or a physical layer device. Additionally, an optoelectronic module can couple to a host printed circuit board in a number of ways. The optoelectronic module can be fixed or replaceable. A fixed optoelectronic module has pins which are typically soldered to the host printed circuit board. The replaceable optoelectronic module typically has a connector with pins or traces which couple to a connector or socket of the host printed circuit board.

Figure 10:
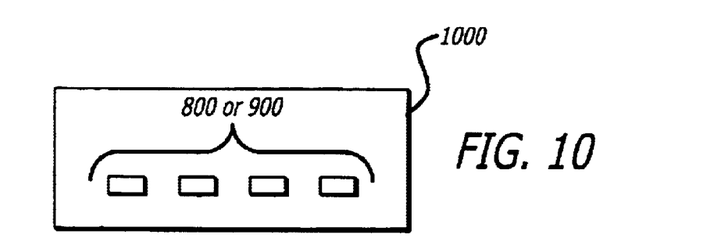
FIG. 10 illustrates a block diagram of an optoelectronic system with optoelectronic module which incorporate the tunable laser diode of the invention.

Referring now to FIG. 10, an optoelectronic system 1000 is illustrated. The optoelectronic system 1000 can be utilized in an optical communication system, optical networking system, or other system where transfer of information is desirable over optical fibers by means of light or photons. The optoelectronic system 1000 includes one or more optoelectronic modules 800 or 900 or a combination thereof. The optoelectronic system 1000 couples to one or more optical fibers.

The invention has a number of advantages over the prior art that those of ordinary skill in the art will recognize after thoroughly reading this disclosure.

The preferred embodiments of the invention are thus described. While the invention has been described in particular embodiments, the invention should not be construed as limited by such embodiments, but rather construed according to the claims that follow below.

What is claimed is:

1. A tunable long wavelength vertical cavity surface emitting laser comprising:
   a piezo-electric subassembly including a frame having a top portion, a bottom portion, and a side portion coupled between the top portion and the bottom portion, the piezo-electric subassembly having a piezo-electric effect in the side portion in response to an electric field;
   a semiconductor pump laser coupled to the bottom portion of the piezo-electric submount, the semiconductor pump laser electrically pumped to generate photons;
   a first mirror coupled to a laser output region of the semiconductor pump laser, the first mirror transparent to the wavelength of photons generated by the semiconductor pump laser; and
   a long wavelength vertical cavity surface emitting laser coupled to the top portion of the piezo-electric submount to form a gap with the first mirror, the long wavelength vertical cavity surface emitting laser optically pumped by photons having a wavelength generated by the semiconductor pump laser that is less than the wavelength of photons generated by the long wavelength vertical cavity surface emitting laser, the long wavelength vertical cavity surface emitting laser having an adjustable laser cavity to tune the wavelength of photons generated by long wavelength vertical cavity surface emitting laser in response to the electric field applied across the piezo-electric subassembly.

2. The tunable long wavelength vertical cavity surface emitting laser of claim 1, wherein
   the adjustable laser cavity of the long wavelength vertical cavity surface emitting laser includes
      the first mirror coupled to the laser output region of the semiconductor pump laser, the first mirror to reflect photons having the wavelength generated by the long wavelength vertical cavity surface emitting laser,
      the gap between the first mirror and the long wavelength vertical cavity surface emitting laser, the gap having an adjustable gap distance responsive to the electric field applied across the piezo-electric subassembly to tune the wavelength of photons generated by the long wavelength vertical cavity surface emitting laser,
      an active region having one or more quantum wells to generate photons, the active region having a first side facing towards the first mirror separated by the gap, and
      a second mirror coupled to a second side of the active region on one side and the top portion of the piezo-electric subassembly on an opposite side, the second mirror to reflect photons having the wavelength generated by the long wavelength vertical cavity surface emitting laser.

3. The tunable long wavelength vertical cavity surface emitting laser of claim 1, wherein
   the piezo-electric effect is a mechanical stress in the side portion of the piezo-electric subassembly to modify the adjustable laser cavity in response to the electric field applied across the piezo-electric subassembly.

4. The tunable long wavelength vertical cavity surface emitting laser of claim 1, wherein
   the semiconductor pump laser is selected from the group of a vertical cavity surface emitting laser, a horizontal cavity surface emitting laser, and a folded cavity surface emitting laser.

5. The tunable long wavelength vertical cavity surface emitting laser of claim 2, wherein
   the first mirror is a distributed Bragg reflector.

6. The tunable long wavelength vertical cavity surface emitting laser of claim 2, wherein
   the second mirror is a distributed Bragg reflector.

7. The tunable long wavelength vertical cavity surface emitting laser of claim 1, wherein
   the semiconductor pump laser generates photons having a wavelength over the range of six hundred thirty nanometers (630 nm) to one thousand nanometers (1000 nm).

8. The tunable long wavelength vertical cavity surface emitting laser of claim 1, wherein
   the long wavelength vertical cavity surface emitting laser generates photons having a center wavelength over the range of one thousand two hundred nanometers (1200 nm) to one thousand seven hundred nanometers (1700 nm).

9. The tunable long wavelength vertical cavity surface emitting laser of claim 1, wherein
   the adjustable laser cavity of the long wavelength vertical cavity surface emitting laser tunes the wavelength of photons generated by the long wavelength vertical cavity surface emitting laser between zero nanometers (0 nm) and fifty nanometers (50 nm) from a center wavelength for which the long wavelength vertical cavity surface emitting laser was designed to generate.

10. The tunable long wavelength vertical cavity surface emitting laser of claim 9, wherein
    the long wavelength vertical cavity surface emitting laser generates photons has one center wavelength selected in the range of one thousand two hundred nanometers (1200 nm) to one thousand seven hundred nanometers (1700 nm) and the adjustable laser cavity tunes the wavelength of photons around the one center wavelength.

11. A wavelength tunable long wavelength vertical cavity surface emitting laser comprising:
    a piezo-electric submount having a top portion, a side portion, and a bottom portion;

a short wavelength semiconductor pump laser coupled to the bottom portion of the piezo-electric submount;

a first distributed Bragg reflector coupled to a laser output region of the short wavelength semiconductor laser; and a long wavelength vertical cavity surface emitting laser coupled to the top portion of the piezo-electric submount, the long wavelength vertical cavity surface emitting laser having a resonant cavity including
a second distributed Bragg reflector,
an active region coupled to the second distributed Bragg reflector on one side, the active region forming a gap with the first distributed Bragg reflector,
the gap having an adjustable gap distance responsive to a voltage coupled to the top portion and the bottom portion of the piezo-electric submount to tune the wavelength of the long wavelength vertical cavity surface emitting laser, and
the first distributed Bragg reflector.

12. The wavelength tunable long wavelength vertical cavity surface emitting laser of claim 11, wherein
a mechanical stress in the side portion of the piezo-electric submount changes the adjustable gap distance in response to the voltage coupled to the top portion and the bottom portion.

13. The wavelength tunable long wavelength vertical cavity surface emitting laser of claim 11, wherein
the short wavelength semiconductor pump laser is a vertical cavity surface emitting laser.

14. The wavelength tunable long wavelength vertical cavity surface emitting laser of claim 11, wherein
the short wavelength semiconductor pump laser is a horizontal cavity surface emitting laser.

15. The wavelength tunable long wavelength vertical cavity surface emitting laser of claim 11, wherein
the short wavelength semiconductor pump laser is a folded cavity surface emitting laser.

16. The wavelength tunable long wavelength vertical cavity surface emitting laser of claim 11, wherein
the short wavelength semiconductor pump laser generates photons having a wavelength over the range of six hundred thirty nanometers (630 nm) to one thousand nanometers (1000 nm).

17. The wavelength tunable long wavelength vertical cavity surface emitting laser of claim 11, wherein
the first distributed Bragg reflector is highly reflective to photons generated by the long wavelength vertical cavity surface emitting laser having a long wavelength.

18. The wavelength tunable long wavelength vertical cavity surface emitting laser of claim 11, wherein
the second distributed Bragg reflector is coupled to the active region of the long wavelength vertical cavity surface emitting laser by being monolithically grown together.

19. The wavelength tunable long wavelength vertical cavity surface emitting laser of claim 11, wherein
the second distributed Bragg reflector is a dielectric distributed Bragg reflector.

20. The wavelength tunable long wavelength vertical cavity surface emitting laser of claim 19, wherein
the second distributed Bragg reflector is coupled to the active region by wafer bonding.

21. The wavelength tunable long wavelength vertical cavity surface emitting laser of claim 11, wherein
the first distributed Bragg reflector is a semiconductor distributed Bragg reflector and is coupled to the short wavelength semiconductor pump laser by being monolithically grown together.

22. The wavelength tunable long wavelength vertical cavity surface emitting laser of claim 11, wherein
the first distributed Bragg reflector is a dielectric distributed Bragg reflector.

23. The wavelength tunable long wavelength vertical cavity surface emitting laser of claim 19, wherein
the first distributed Bragg reflector is coupled to the short wavelength semiconductor pump laser by wafer bonding.

24. The wavelength tunable long wavelength vertical cavity surface emitting laser of claim 11, wherein
the piezo-electric submount is formed out of lead zirconite-titanate (PZT).

25. A wavelength tunable optically pumped long wavelength vertical cavity surface emitting laser comprising:
a piezo-electric submount having a top portion including a sleeve and a bottom portion;
an optical fiber coupled into the sleeve of the piezo-electric submount, the optical fiber to provide pump power from a pump laser, the optical fiber having a dielectric distributed Bragg reflector coupled to a core tip, the dielectric distributed Bragg reflector being highly reflective at the operating wavelength of the optically pumped long wavelength vertical cavity surface emitting laser; and
a long wavelength vertical cavity surface emitting laser coupled to the bottom portion of the piezo-electric submount to form a gap with the dielectric distributed Bragg reflector coupled to the core tip of the optical fiber.

26. The wavelength tunable optically pumped long wavelength vertical cavity surface emitting laser of claim 25, wherein
the long wavelength vertical cavity surface emitting laser has a resonant cavity including,
a distributed Bragg reflector;
an active region coupled to the distributed Bragg reflector on one side and the piezo-electric submount on another side to form the gap with the dielectric distributed Bragg reflector,
the gap having an adjustable gap distance responsive to a voltage coupled to the top portion and the bottom portion of the piezo-electric submount to tune the wavelength of the long wavelength vertical cavity surface emitting laser,
and the dielectric distributed Bragg reflector.

27. The wavelength tunable optically pumped long wavelength vertical cavity surface emitting laser of claim 25, wherein
the piezo-electric submount is formed out of lead zirconite-titanate (PZT).

28. The wavelength tunable optically pumped long wavelength vertical cavity surface emitting laser of claim 25, wherein
the pump laser is a high power short wavelength semiconductor laser to generate the pump power provided over the optical fiber.

29. The wavelength tunable optically pumped long wavelength vertical cavity surface emitting laser of claim 28, wherein
the pump laser generates photons at a wavelength over the range of six hundred thirty nanometers (630 nm) and one thousand nanometers (1000 nm).

30. The wavelength tunable optically pumped long wavelength vertical cavity surface emitting laser of claim 25, wherein
the distributed Bragg reflector is highly reflective to photons generated by the long wavelength vertical cavity surface emitting laser having a long wavelength.

31. The wavelength tunable optically pumped long wavelength vertical cavity surface emitting laser of claim 25, wherein
the distributed Bragg reflector is coupled to the active region of the long wavelength vertical cavity surface emitting laser by being monolithically grown together.

32. The wavelength tunable optically pumped long wavelength vertical cavity surface emitting laser of claim 25, wherein
the distributed Bragg reflector is a dielectric distributed Bragg reflector.

33. The wavelength tunable optically pumped long wavelength vertical cavity surface emitting laser of claim 32, wherein
the distributed Bragg reflector is coupled to the active region by wafer bonding.

34. The wavelength tunable optically pumped long wavelength vertical cavity surface emitting laser of claim 25, wherein
the long wavelength vertical cavity surface emitting laser further has a substrate.

35. The wavelength tunable optically pumped long wavelength vertical cavity surface emitting laser of claim 25, wherein
output photons from the long wavelength vertical cavity surface emitting laser are transmitted through the substrate.

36. The wavelength tunable optically pumped long wavelength vertical cavity surface emitting laser of claim 25, wherein
output photons from the long wavelength vertical cavity surface emitting laser are transmitted back into the optical fiber.

37. The wavelength tunable optically pumped long wavelength vertical cavity surface emitting laser of claim 25, wherein
the wavelength of the long wavelength vertical cavity surface emitting laser is tuned by applying a voltage between the top portion and the bottom portion of the piezo-electric submount.

38. A wavelength tunable laser system comprising:
a pump laser to generate a pump source of photons;
a piezo-electric subassembly including a top portion, a bottom portion, and a sleeve, the piezo-electric subassembly having a piezo-electric effect;
a long wavelength vertical cavity surface emitting laser coupled to the bottom portion of the piezo-electric subassembly, the long wavelength vertical cavity surface emitting laser optically pumped by photons having a wavelength generated by the pump laser that is less than the wavelength of photons generated by the long wavelength vertical cavity surface emitting laser, the long wavelength vertical cavity surface emitting laser having an adjustable laser cavity to tune the wavelength of photons generated by long wavelength vertical cavity surface emitting laser in response to the piezo-electric effect in the piezo-electric subassembly; and
a first optical fiber having a tip with a dielectric coating, the first optical fiber coupled to the sleeve of the piezo-electric subassembly to form a gap in the adjustable laser cavity of the long wavelength vertical cavity surface emitting laser, the first optical fiber to couple photons from the pump laser into the adjustable laser cavity of the long wavelength vertical cavity surface emitting laser.

39. The wavelength tunable laser system of claim 38, wherein
the adjustable laser cavity of the long wavelength vertical cavity surface emitting laser includes
the dielectric coating of the tip of the optical fiber, the dielectric coating to reflect photons having the wavelength generated by the long wavelength vertical cavity surface emitting laser,
the gap in the adjustable laser cavity between the dielectric coating of the first optical fiber and an active region of the long wavelength vertical cavity surface emitting laser, the gap having an adjustable gap distance responsive to the electric field applied across the piezo-electric subassembly to adjust the adjustable laser cavity and tune the wavelength of photons generated by the long wavelength vertical cavity surface emitting laser,
the active region coupled to the bottom portion of the piezo-electric subassembly on a first side, the active region having one or more quantum well structures to generate photons, and
a distributed Bragg reflector coupled to a second side of the active region, the distributed Bragg reflector to reflect low energy photons having the wavelength generated by the long wavelength vertical cavity surface emitting laser and to pass high energy photons having the wavelength generated by the long wavelength vertical cavity surface emitting laser.

40. The wavelength tunable laser system of claim 38 further comprising:
a directional coupler coupled to the first optical fiber between the pump laser and the long wavelength vertical cavity surface emitting laser,
a second optical fiber coupled to the pump laser at a first end and the direction coupler at a second end,
a third optical fiber coupled to the directional coupler at a first end, the third optical fiber to output photons of the long wavelength vertical cavity surface emitting laser at a second end, and
the directional coupler
to receive photons from the pump laser over the second optical fiber and couple them into the first optical fiber and
to receive photons from the long wavelength vertical cavity surface emitting laser over the first optical fiber and couple them into the third optical fiber.

41. The wavelength tunable laser system of claim 40, wherein
the adjustable laser cavity of the long wavelength vertical cavity surface emitting laser includes
the dielectric coating of the tip of the optical fiber, the dielectric coating to reflect photons having the wavelength generated by the long wavelength vertical cavity surface emitting laser,
the gap in the adjustable laser cavity between the dielectric coating of the first optical fiber and an active region of the long wavelength vertical cavity surface emitting laser, the gap having an adjustable gap distance responsive to the electric field applied across the piezo-electric subassembly to adjust the adjustable laser cavity and tune the wavelength of photons generated by the long wavelength vertical cavity surface emitting laser, the active region coupled to the bottom portion of the piezo-electric subassembly on a first side, the active region having one or more quantum well structures to generate photons, and a distributed Bragg reflector coupled to a second side of the active region, the distributed Bragg reflector to reflect photons having the wavelength generated by the long wavelength vertical cavity surface emitting laser.

42. A fiber optic module comprising:

a tunable diode transmitter having a long wavelength vertical cavity surface emitting laser to transmit photons over a first optical fiber, the long wavelength vertical cavity surface emitting laser including a piezo-electric subassembly including a frame having a top portion, a bottom portion, and a side portion coupled between the top portion and the bottom portion, the piezo-electric subassembly having a piezo-electric effect in the side portion in response to an electric field;

a semiconductor pump laser coupled to the bottom portion of the piezo-electric submount, the semiconductor pump laser electrically pumped to generate photons;

a first mirror coupled to a laser output region of the semiconductor pump laser, the first mirror transparent to the wavelength of photons generated by the semiconductor pump laser; and a long wavelength vertical cavity surface emitting laser coupled to the top portion of the piezo-electric submount to form a gap with the first mirror, the long wavelength vertical cavity surface emitting laser optically pumped by photons having a wavelength generated by the semiconductor pump laser that is less than the wavelength of photons generated by the long wavelength vertical cavity surface emitting laser, the long wavelength vertical cavity surface emitting laser having an adjustable laser cavity to tune the wavelength of photons generated by long wavelength vertical cavity surface emitting laser in response to the electric field applied across the piezo-electric subassembly.

43. The fiber optic module of claim 42, wherein the adjustable laser cavity of the long wavelength vertical cavity surface emitting laser includes the first mirror coupled to the laser output region of the semiconductor pump laser, the first mirror to reflect photons having the wavelength generated by the long wavelength vertical cavity surface emitting laser, the gap between the first mirror and the long wavelength vertical cavity surface emitting laser, the gap having an adjustable gap distance responsive to the electric field applied across the piezo-electric subassembly to tune the wavelength of photons generated by the long wavelength vertical cavity surface emitting laser, an active region having one or more quantum well structures to generate photons, the active region have a first side facing the first mirror and separated by the gap, and a second mirror coupled to a second side of the active region on one side and the top portion of the piezo-electric subassembly on an opposite side, the second mirror to reflect photons having the wavelength generated by the long wavelength vertical cavity surface emitting laser.

44. The fiber optic module of claim 42, wherein the piezo-electric effect is a mechanical stress in the side portion of the piezo-electric subassembly to modify the adjustable laser cavity in response to the electric field applied across the piezo-electric subassembly.

45. The fiber optic module of claim 42, wherein the semiconductor pump laser is selected from the group of a vertical cavity surface emitting laser, a horizontal cavity surface emitting laser, and a folded cavity surface emitting laser.

46. The fiber optic module of claim 43, wherein the first mirror is a distributed Bragg reflector.

47. The fiber optic module of claim 43, wherein the second mirror is a distributed Bragg reflector.

48. The fiber optic module of claim 42, wherein the semiconductor pump laser generates photons having a wavelength over the range of six hundred thirty nanometers (630 nm) to one thousand nanometers (1000 nm).

49. The fiber optic module of claim 42, wherein the long wavelength vertical cavity surface emitting laser generates photons having a center wavelength over the range of one thousand two hundred nanometers (1200 nm) to one thousand seven hundred nanometers (1700 nm).

50. The fiber optic module of claim 42, wherein the adjustable laser cavity of the long wavelength vertical cavity surface emitting laser tunes the wavelength of photons generated by the long wavelength vertical cavity surface emitting laser between zero nanometers (0 nm) and fifty nanometers (50 nm) from a center wavelength for which the long wavelength vertical cavity surface emitting laser was designed to generate.

51. The fiber optic module of claim 42, wherein the fiber optic module is a fiber optic transceiver module and further comprises a photo detector to receive photons from a second optical fiber.

52. The fiber optic module of claim 42, wherein the fiber optic module is a fiber optic transmitting module and further comprises a plurality of tunable diode transmitters having the long wavelength vertical cavity surface emitting laser to transmit photons over a plurality of optical fibers.

* * * * *